US007168834B2

(12) United States Patent
Takeda et al.

(10) Patent No.: US 7,168,834 B2
(45) Date of Patent: Jan. 30, 2007

(54) VEHICULAR LAMP

(75) Inventors: Hitoshi Takeda, Shizuoka-ken (JP); Tsukasa Tokida, Shizuoka-ken (JP); Takumi Inoue, Tokushima-ken (JP)

(73) Assignees: Koito Manufacturing Co., Ltd., Tokyo (JP); Nichia Corporation, Tokushima (JP)

( * ) Notice: Subject to any disclaimer, the term of this patent is extended or adjusted under 35 U.S.C. 154(b) by 72 days.

(21) Appl. No.: 10/949,881

(22) Filed: Sep. 24, 2004

(65) Prior Publication Data

US 2005/0117361 A1 Jun. 2, 2005

(30) Foreign Application Priority Data

Sep. 25, 2003 (JP) ............................ 2003-333116
Aug. 18, 2004 (JP) ............................ 2004-237912

(51) Int. Cl.
*F21V 11/00* (2006.01)

(52) U.S. Cl. ....................... 362/510; 362/231; 362/545

(58) Field of Classification Search ................ 362/510, 362/540–543, 545, 555, 583, 230–231, 800; 252/301.4 F, 301.4 R; 257/103; 313/498, 313/501, 502–504

See application file for complete search history.

(56) References Cited

U.S. PATENT DOCUMENTS 5,711,592 A * 1/1998 Hotta ......................... 362/496
5,813,752 A 9/1998 Singer et al.
5,813,753 A 9/1998 Vriens et al.
6,277,301 B1 * 8/2001 Hohn et al. ............ 252/301.36
6,512,236 B2 * 1/2003 Seville .................... 250/458.1
6,520,669 B1 2/2003 Chen et al.
6,595,669 B2 * 7/2003 Kreutzer et al. ............ 362/493
6,953,952 B2 * 10/2005 Asakawa .................... 257/103

FOREIGN PATENT DOCUMENTS

| | | |
|---|---|---|
| EP | 0 581 232 | 2/1994 |
| EP | 0 936 682 | 8/1999 |
| JP | 2002-231013 | 8/2002 |
| JP | 2003-101081 | 4/2003 |

OTHER PUBLICATIONS

Patent Abstracts of Japan Publication No. 2003-101081 published Apr. 4, 2003.

Patent Abstracts of Japan Publication No. 2003-101081 published Aug. 16, 2002.

Patents Act 1977: Combined Search and Examination Report under Sections 17 and 18(3) issued for British Application No. GB0421464.9 mailed on Sep. 26, 2005, 6 pages.

* cited by examiner

*Primary Examiner*—Ali Alavi
(74) *Attorney, Agent, or Firm*—Osha Liang L.L.P.

(57) ABSTRACT

A vehicular lamp that irradiates amber light includes: a light emitting diode operable to emit blue light; a long-wavelength phosphor operable to emit light of which a peak wavelength is substantially equal to or longer than a wavelength of the umber light based on the blue light emitting from the light emitting diode; and an optical filter operable to block the bulk of light emitting from the light emitting diode and also to transmit the bulk of light, which has a wavelength similar to the peak wavelength, among light emitting from the long-wavelength phosphor to generate the amber light depending to light emitting from the light emitting diode and the long-wavelength phosphor.

11 Claims, 10 Drawing Sheets

10

LIGHTING CONTROLLING UNIT 12 34 24 28 28 22 26 100 32 100 32 100 32

109
112
302
102
212b
210
202
204
206
208
212a
106

VEHICULAR LAMP

This patent application claims priority from a Japanese Patent Application No. 2004-237912 filed on Aug. 18, 2004, and Japanese Patent Application No. 2003-333116 filed on Sep. 25, 2003, the contents of which are incorporated herein by reference.

BACKGROUND OF THE INVENTION

1. Field of the Invention

The present invention relates to a vehicular lamp. More particularly, the present invention relates to a vehicular lamp that irradiates umber amber light. In greater detail, the present invention relates to a turn signal lamp of a vehicular lamp.

2. Description of Related Art

Recently, a vehicular lamp using a light emitting diode is known (cf. Japanese Patent Application Publication (Laid-Open) No. 2002-231013). In addition, a diode using, e.g., AlGaInP or GaAsP, etc. is known as a light emitting diode for generating amber light.

However, in the case of a diode using, e.g., AlGaInP or GaAsP, etc., there was a problem that luminous efficiency decreases if the temperature rises. Furthermore, the temperature of a vehicular lamp can rise due to radiant heat from an engine of a vehicle or sunlight. Thus, in order to ensure an amount of light emitting from the vehicular lamp conventionally, measures to counter a decrease of luminous efficiency have been requested in some cases. For this purpose, the number of the light emitting diodes has been increased, thereby increasing the cost of a vehicular lamp.

SUMMARY OF THE INVENTION

Therefore, it is an object of the present invention to provide a vehicular lamp which can solve the foregoing problems. The above and other objects can be achieved by combinations described in the independent claims. The dependent claims define further advantageous and exemplary combinations of the present invention.

According to the first aspect of the present invention, there is provided a vehicular lamp that irradiates amber light. The vehicular lamp includes: a light emitting diode emitting blue light; a long-wavelength phosphor emitting light, of which a peak wavelength is substantially equal to or longer than a wavelength of the amber light according to the blue light emitting from the light emitting diode; and an optical filter operable to block almost all light emitting from the light emitting diode and also to transmit almost all light, which has a wavelength similar to the peak wavelength, among light emitting from the long-wavelength phosphor to generate the amber light based on the light emitting from the light emitting diode and the long-wavelength phosphor.

The long-wavelength phosphor may include $Y_3Al_5O_{12}$:Ce or $Tb_3Al_5O_{12}$:Ce. The long-wavelength phosphor may include $M_xSi_yN_z$:Eu, where $z=2x/3+4y/3$, M is at least an element selected from a group consisting of alkaline earth metals.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
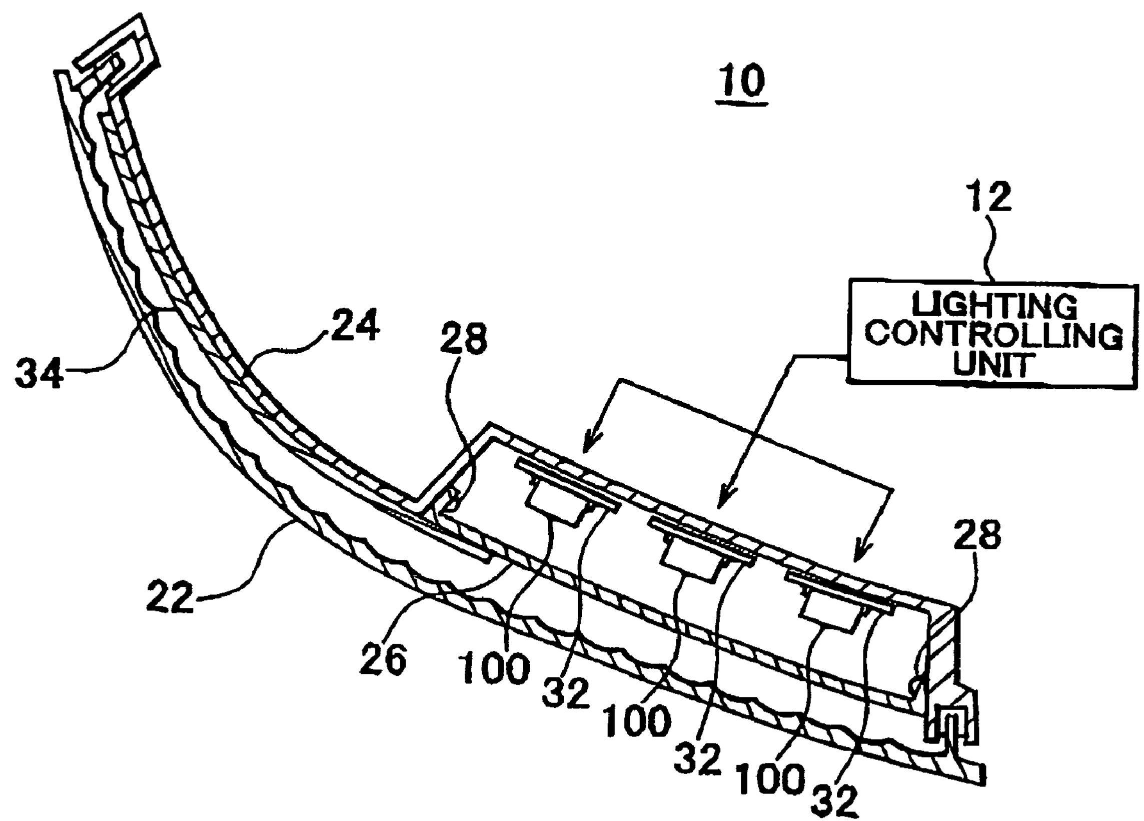
FIG. 1 is a horizontal cross-sectional view of a vehicular lamp according to an embodiment of the present invention.
Figure 2:
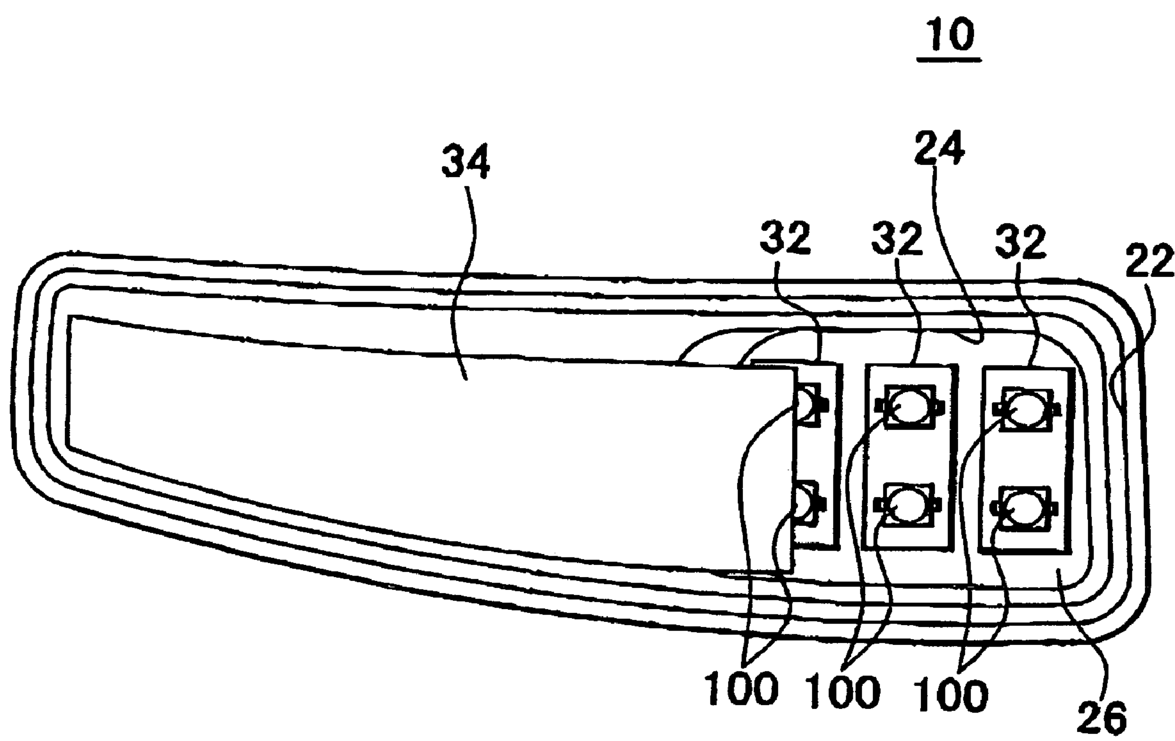
FIG. 2 is a front view of the vehicular lamp.

FIGS. 1 and 2 show an example of structure of a vehicular lamp 10 having a lighting controlling unit 12 according to an embodiment of the present invention. FIG. 1 is a horizontal cross-sectional view of the vehicular lamp 10. FIG. 2 is a front view of the vehicular lamp 10. The vehicular lamp 10 according to the embodiment is a turn signal lamp, and stably irradiates amber light. The vehicular lamp 10 as shown in FIGS. 1 and 2 is provided, e.g., in the right front of a vehicle.

The vehicular lamp 10 includes a lamp body 24, an outer lens 22, a plurality of substrates 32, a plurality of LED modules 100, an optical filter 26 and a light guiding member 34. The lamp body 24 and the outer lens 22 form a chamber that surrounds the vehicular lamp 10. The plurality of substrates 32 and the plurality of LED modules 100 are held within the chamber to waterproof them. The lamp body 24 is formed of, e.g., resin to cover the plurality of substrates 32 and the plurality of LED modules 100 from backward of the vehicle.

The outer lens 22 is formed of, e.g., transparent and colorless materials to cover the front side of the vehicular lamp 10. In this way, the outer lens 22 irradiates light emitting from the LED modules 100 in the front of the vehicle. The outer lens 22 is attached to the lamp body 24, e.g., by hot-melt or welding. Lens steps for controlling light distribution are also provided on a surface facing the plurality of LED modules 100 in the outer lens 22. The outer lens 22 controls irradiation direction of light with the lens steps. In another embodiment, the vehicular lamp 10 may control irradiation direction of light, e.g., with reflecting mirrors provided behind the LED modules 100.

Each of the plurality of substrates 32 fixes each of the plurality of LED modules 100. In addition, each of the plurality of substrates 32 electrically connects the plurality of LED modules 100 to the lighting controlling unit 12. The substrates 32 may be fixed to the lamp body 24.

Each of the plurality of LED modules 100 lights by receiving power from the lighting controlling unit 12 via the substrates 32. In the present embodiment, the LED modules 100 emit white light in response to the power. In this way, although the temperature of the vehicular lamp 10 increases, the LED modules 100 can generate light, of which an amount of light and a wavelength are stable. The LED modules 100 intermittently lights, e.g., by receiving intermittent power from the lighting controlling unit 12. The lighting controlling unit 12 is a lighting circuit for lighting the plurality of LED modules 100. The lighting controlling unit 12 generates intermittent power by, e.g., a flasher relay to supply the power to the plurality of LED modules 100.

The optical filter 26 is, e.g., an inner lens, a color sheet or the like, being provided between the plurality of LED modules 100 and the outer lens 22. In this way, the optical filter 26 transmits light emitting from the plurality of LED modules 100 to supply the light to the outer lens 22. The optical filter 26 is fixed to the lamp body 24 by a plurality of screws 28. The optical filter 26 may be also fixed to the lamp body 24 by a lance. In the present embodiment, the optical filter 26 is transparently formed of colored and transparent materials. Thus, the optical filter 26 generates light of a predetermined color to supply the light to the outer lens 22 based on white light received from the LED modules 100.

The optical filter 26 is, e.g., a filter that transmits light having a wavelength not less than 550 nm. In the present embodiment, the predetermined color light generated by the optical filter 26 to use in the vehicular lamp is amber light. In this way, the vehicular lamp 10 generates amber light based on white light emitting from the LED modules 100. Moreover, the amber color is the color of light that has to be used in a turn signal lamp of a vehicular lamp.

The light guiding member 34 is formed from a part of the front of the optical filter 26 to a lateral face of the vehicle so as to cover at least a part of the front of the lamp body 24. In this way, the light guiding member 34 guides the amber light that transmits the optical filter 26 to the lateral face of the vehicle. As a result, the vehicular lamp 10 generates the amber light from the substantially whole face of the outer lens 22. According to the present embodiment, the vehicular lamp 10 can irradiate amber light stably and appropriately.

Figure 3:
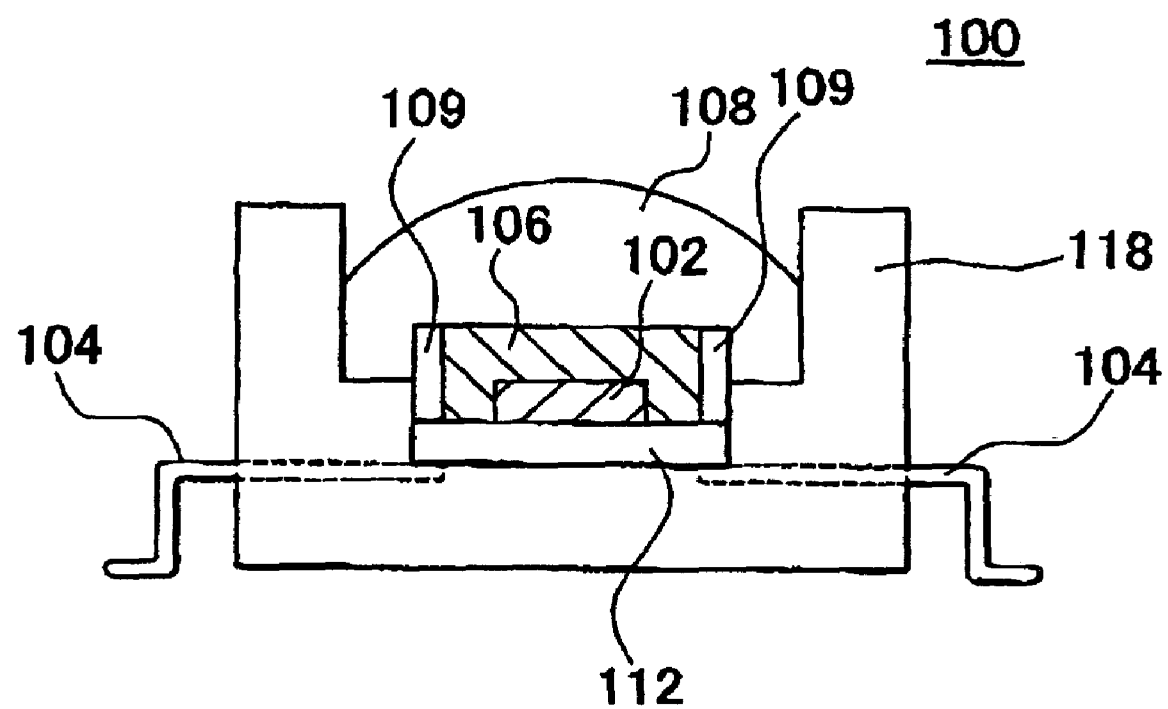
FIG. 3 shows an example of structure of an LED module.

FIG. 3 shows an example of structure of the LED module 100. The LED module 100 includes a plurality of electrodes 104, a substrate 112, cavities 109, a hold part 118, a sealing member 108, a light emitting diode 102, and a phosphor 106.

The plurality of electrode 104 is electrically connected to the substrate 32 (see FIG. 1), and supplies power received from the lighting controlling unit 12 via the substrate 32 (see FIG. 1) to the light emitting diode 102 via the substrate 112.

The substrate 112 has a plate-like shape, and fixes the light emitting diode 102 thereon. In addition, the substrate 112 includes a wiring that electrically connects the electrodes 104 to the light emitting diode 102, thereby supplying power received from the lighting controlling unit 12 via the electrodes 104 to the light emitting diode 102. The cavities 109 are wall surfaces formed on the substrate 112 to surround the light emitting diode 102. The phosphor 106 is held in a cavity of an interior surrounded by the wall surfaces. In this way, the phosphor 106 is held to cover the light emitting diode 102.

The hold part 118 holds the plurality of electrode 104, the substrate 112, the cavities 109, and the sealing member 108. In addition, at least a part of the hold part 181 formed of materials having thermal conductivity higher than that of air, e.g., such as metal, transferring heat generated by the light emitting diode 102 out of the LED module 100. The sealing member 108 is a mold for sealing the light emitting diode 102. The sealing member 108 is formed of, e.g., transparent resin.

The light emitting diode 102 is a LED device using, e.g., InGaN, emitting blue light based on power received from the lighting controlling unit 12. The substantially whole surface of the light emitting diode 102 facing the sealing member 108 is an emission area of light, and light is emitted through the emission area.

The phosphor 106 is designed to cover the surface of the light emitting diode 102, generating light that has a wavelength longer than that of blue light based on blue light emitting from the light emitting diode 102. In another embodiment, the phosphor 106 may be provided within the sealing member 108. In the present embodiment, the phosphor 106 generates yellow light, which is complementary color of blue light. In this case, the LED module 100 generates white light based on blue light and yellow light emitting from the light emitting diode 102 and the phosphor 106. According to the present embodiment, the LED module 100 can appropriately generate white light.

Preferably, the LED module 100 may generate white light similar to electric bulb color. The LED module 100 may generate white light corresponding to a black body radiation locus of color temperature 2500 K to 3500 K.

Figure 4:
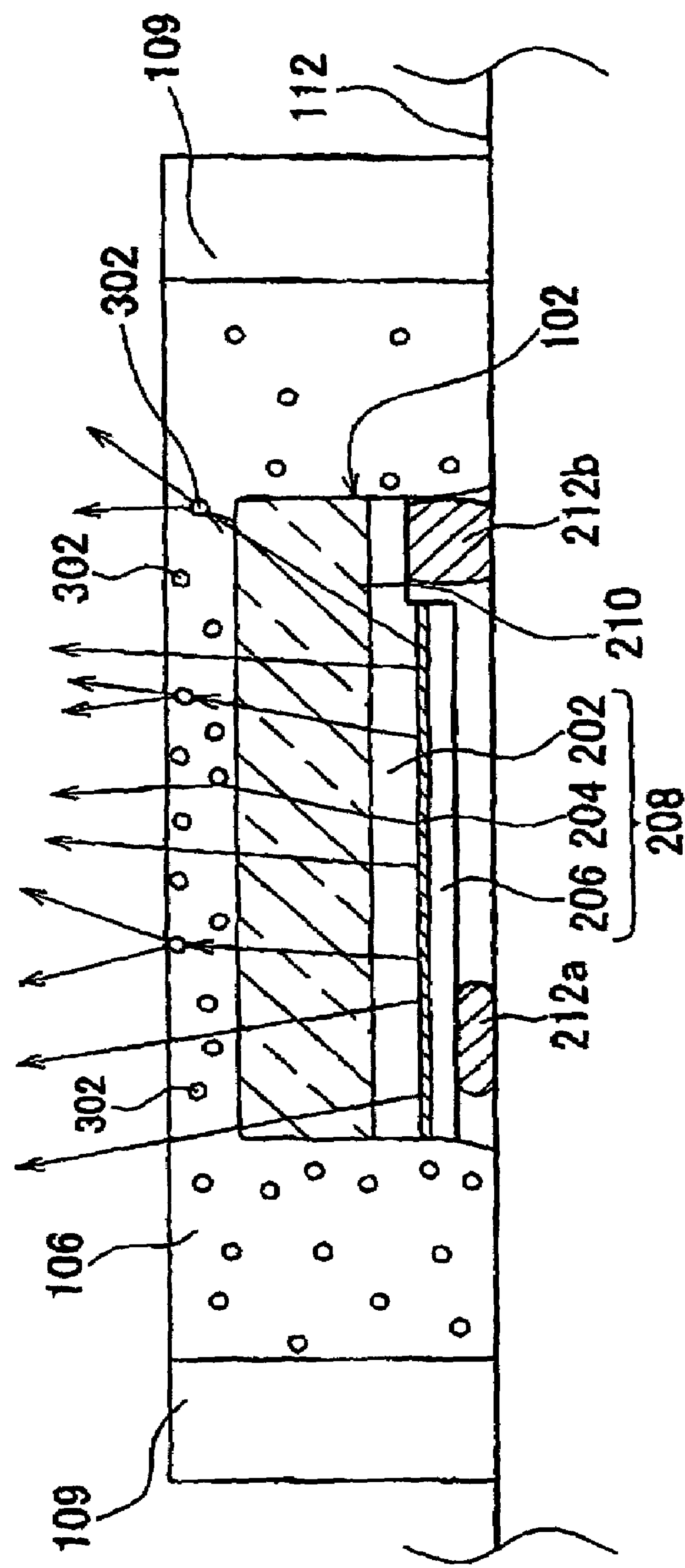
FIG. 4 shows an example of detailed structure of a light emitting diode and a phosphor.

FIG. 4 shows an example of detailed structure of the light emitting diode 102 and the phosphor 106 along with the substrate 112, the cavities 109 and electrodes 212*a* and 212*b*. The electrodes 212*a* and 212*b* are, e.g., a solder bump, electrically connecting the light emitting diode 102 to the substrate 112.

In the present embodiment, the light emitting diode 102 includes a sapphire substrate 210 and a semiconductor layer 208. The light emitting diode 102 is mounted on the substrate 112 by flip chip bonding so that the sapphire substrate 210 is positioned to face the substrate 112 holding the semiconductor layer 208 therebetween. In addition, the semiconductor layer 208 includes N type GaN layer 202, InGaN layer 204, and P type GaN layer 206. There is $Al_xIn_yGa_{1-x-y}N$ ($0 \leqq x \leqq 1$, $0 \leqq y \leqq 1$, $x+y \leqq 1$) as the GaN based semiconductor layer. Moreover, since the GaN based semiconductor layer is an additive-free layer to which impurities are not doped, the GaN based semiconductor layer can be used as N type layer. However, each dopant of an acceptor and a donor is doped into the GaN based semiconductor layer, so GaN based semiconductor layers for each conductive type are formed. N type impurities include Si, Ge and Sn, and preferably include Si. P type impurities, are particularly not limited to these, include Be, Zn, Mn, Cr, Mg, Ca, etc., and preferably include Mg. The N type GaN layer 202, InGaN layer 204, and P type GaN layer 206 are sequentially laminated on the sapphire substrate 210 toward the substrate 112 side. The other layers may be provided between these layers.

In this case, the N type GaN layer 202 is connected to the substrate 112 via the electrode 212*b*. The N type GaN layer 202 may be also formed on the sapphire substrate 210 holding the $Al_xIn_yGa_{1-x-y}N$ ($0 \leqq x \leqq 1$, $0 \leqq y \leqq 1$, $x+y \leqq 1$) buffer layer therebetween.

The InGaN layer 204 serves as a luminescent layer. The InGaN layer 204 may be formed by doping an N type or P type dopant, and preferably may be formed by doping Si. In addition, the InGaN layer 204 is formed on the N type GaN layer 202 holding, e.g., an N type AlGaN layer therebetween. The P type GaN layer 206 is formed on the InGaN layer 204 holding, e.g., an P type AlGaN layer therebetween, being connected to the substrate 112 via the electrode 212*a*.

In this way, the semiconductor layer 208 generates blue light having, e.g., a wavelength of 440 nm to 460 nm based on power received through the electrodes 212*a* and 212*b* and the substrate 112. The semiconductor layer 208 irradiates the generated light toward the sapphire substrate 210 to transmit the sapphire substrate 210.

The phosphor 106 is positioned to face the substrate 112 holding the light emitting diode 102 therebetween to cover the light emitting diode 102. The phosphor 106 is as thin as it transmits at least a part of light emitting from the light emitting diode 102, and may be formed in the form of lamina.

In the present embodiment, the phosphor 106 includes fluorescent materials 302. The phosphor 106 may be formed in the form of lamina by containing powder of the fluorescent materials 302 into resin etc. The fluorescent materials 302 are yttrium aluminum garnet based fluorescent material activated by cerium. Additionally, in the present embodiment, it is preferable that at least a part of Al of the fluorescent materials 302 is replaced with Ga, and at least a part of Y is replaced with Gd. In this case, the fluorescent materials 302 generate light of which the wavelength is longer or shorter than those without the replacement. The fluorescent materials 302 include $Y_3Al_5O_{12}$:Ce and/or $Tb_3Al_5O_{12}$:Ce. The fluorescent materials 302 may be $(RE_{1-x}SM_x)_3(Al_{1-y-z}In_yGa_z)_5O_{12}$:Ce, where, $0 \leqq x \leqq 1$, $0 \leqq y \leqq 1$, $0 \leqq z \leqq 1$, $y+z \leqq 1$, and RE is at least an element selected from a group consisting of Y, Gd, and La.

In this way, the phosphor 106 of the present embodiment generates light having a wavelength of 580 nm to 600 nm based on blue light emitting from the light emitting diode 102. The phosphor 106 may generate light of which a peak wavelength is substantially equal to or longer than a wavelength of amber light based on the blue light. The phosphor 106 is an example of a long-wavelength phosphor.

In another embodiment, the phosphor 106 may be formed by mixing yttrium aluminum garnet based fluorescent material activated by cerium and fluorescent material for generating red light. The fluorescent material for generating red light includes, e.g., $M_xSi_yN_z$:Eu ($z=2x/3+4y/3$, M is at least an element selected from a group consisting of alkaline earth metals). In this case, the phosphor 106 generates light of which a peak wavelength is substantially equal to or longer than a wavelength of the amber light.

In the present embodiment, the LED module 100 generates white light by mixing light emitting from the light emitting diode 102 and light emitting from the phosphor 106. According to the present embodiment, it is possible to generate white light appropriately.

Figure 5:
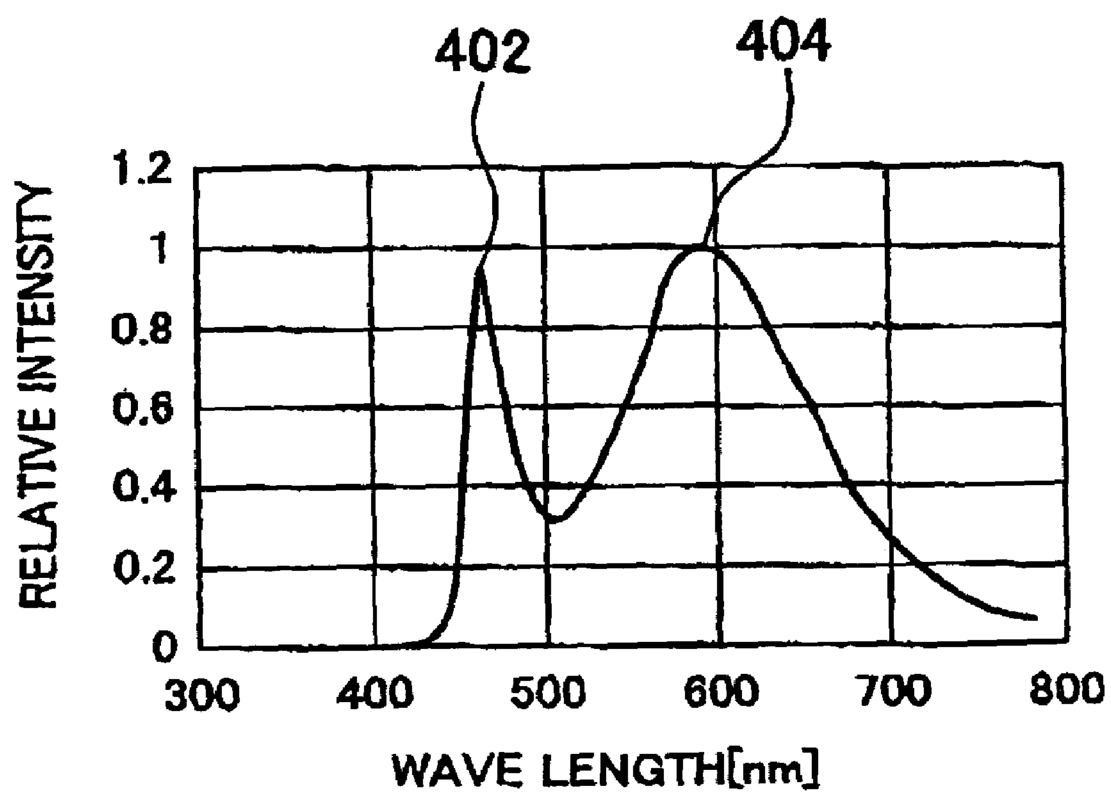
FIG. 5 shows an example of spectrum of white light emitting from the LED module.

FIG. 5 shows an example of spectrum of white light emitting from the LED module 100. In the present embodiment, the LED module 100 generates spectral light having two peaks 402 and 404 based on light emitting from the light emitting diode 102 and light emitting from the phosphor 106. In this case, the peak 402 is generated by blue light emitting from the light emitting diode 102 and the peak 404 is generated by light emitting from the phosphor 106.

Figure 6:
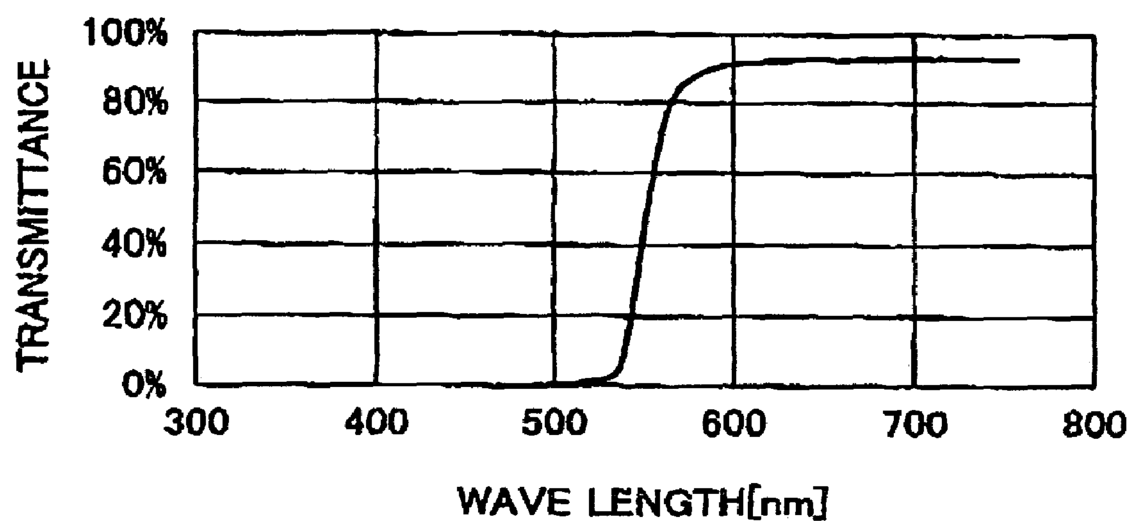
FIG. 6 shows an example of transmittance of an optical filter.

FIG. 6 shows an example of transmittance of the optical filter 26. In the present embodiment, the optical filter 26 blocks almost all parts of light having a wavelength not more than 500 nm. Moreover, the optical filter 26 transmits almost all parts, i.e., 90% or more of light having a wavelength not less than 600 nm.

In this case, the optical filter 26 blocks almost all parts of light having a wavelength having the peak 402 (see FIG. 5). In this way, the optical filter 26 blocks almost all parts of blue light emitting from the light emitting diode 102. Moreover, the optical filter 26 transmits almost all parts of light having a wavelength having the peak 404 (see FIG. 5). In this way, the optical filter 26 transmits almost all parts of light having a wavelength in the vicinity of the peak 404 among light emitting from the phosphor 106.

More particularly, the optical filter 26 blocks almost all parts of light having shorter wavelength than that of a position 403 of which light intensity is lowest among light of continuous spectrum emitted from the light emitting diode and the long-wavelength phosphor. At this time, the position 403 is located between the wavelength of the peak 402 of light emitting from the light emitting diode and the wavelength of the peak 404 of light emitting from the long-wavelength phosphor in spectrum of white light shown in FIGS. 5 and 10A.

Figure 10A:
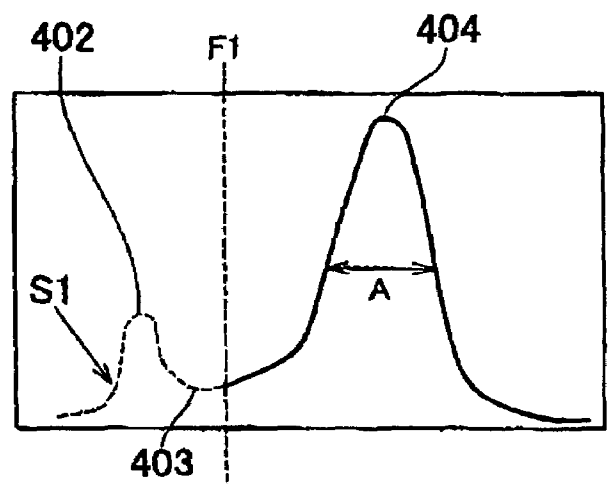
FIG. 10A is a schematic view of emission spectrum of the vehicular lamp according to the present invention.

Furthermore, as shown in FIG. 10A, it is preferable that a transmission limit F1 (see FIGS. 10A, 10B and 10*c*) in the optical filter 26 is located between the peak wavelength 402 of light emitting from the light emitting diode and the peak wavelength 404 of light emitting from the long-wavelength phosphor, and is located at longer wavelength side than that of the position 403 of which light intensity is lowest among light of continuous spectrum S1 emitted from the light emitting diode and the long-wavelength phosphor and also located at shorter wavelength side than that of the peak 404 of light emitting from the long-wavelength phosphor. The optical filter 26 blocks almost all parts, e.g., 90% or more of light having shorter wavelength than the transmission limit F1 and transmits at least a part of light having longer wavelength than the transmission limit F1. The transmission limit F1 is a wavelength when transmittance of the optical filter 26 (see FIG. 6) has a gradient of about 45°.

The spectrum of light emitting from the phosphor ensures sufficient half bandwidth by provision of the continuous spectrum S1 and the transmission limit F1. Therefore, it is possible to obtain a vehicular lamp excellent to visibility.

Moreover, the transmission limit F1 in the optical filter may be located at shorter wavelength side than that of 50% of the peak of light emitting from the long-wavelength phosphor. Therefore, it is possible to obtain a vehicular lamp having excellent visibility.

As described above, the transmission limit F1 is located at longer wavelength side than that of the position 403 of which light intensity is lowest among light of continuous spectrum S1 emitted from the light emitting diode and the long-wavelength phosphor, located between the position 403 having the lowest light intensity and the peak wavelength 404 of light emitting from the long-wavelength phosphor, and is located at shorter wavelength side than that of 50% of the peak 404 with regard to the light intensity. Therefore, the light emitting diode according to the present invention has the excellent effects relative to a light emitting diode using the conventional AlInGaP based or GaAsP based semiconductor, which will be explained hereinafter.

Figure 10B:
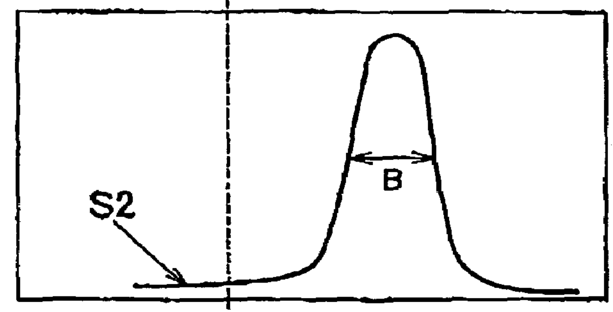
FIG. 10B is a schematic view of emission spectrum of a lamp for emitting amber light using an AlInGaP based semiconductor.
Figure 10C:
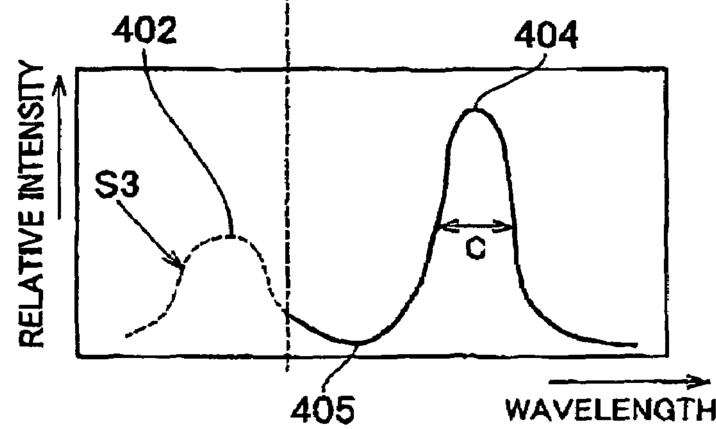
FIG. 10C is a schematic view of emission spectrum of a lamp according to an alternative example of the present invention.

FIGS. 10A to 10C are schematic views of each emission spectrum of the vehicular lamp according to the present invention, a lamp for emitting amber light using an AlInGaP based semiconductor, and a lamp according to an alternative example of the present invention. FIG. 10A shows luminescent spectrum, in which the shorter wavelength side than the transmission limit F1 is blocked by the optical filter among the white light spectrum S1 according to the present embodiment, the rest light is emitted from the vehicular lamp to the outside (showed by solid line, FIG. 10C as well).

By the vehicular lamp according to the present embodiment, half wavelength A of amber spectrum of the present embodiment can be larger than half wavelength B of luminescent spectrum S2 of a light emitting diode that emits amber light using an AlInGaP based semiconductor shown in FIG. 10B. This is because the spectrum of the present invention has the peak wavelength 404 of the amber light continued from the peak 402 of the blue light emitting from the light emitting diode, that is, because the lower part of the peak of the spectrum by the phosphor is extended toward short wavelength side. In this way, since the half wavelength of the spectrum is larger, when it is used as a turn signal lamp, it not only excels in visibility, but also it can be a vehicular lamp with the sufficient visibility for not only a physically unimpaired person but also for achromats. A light emitting diode that emits amber light using AlInGaP or the like has spectrum having small half wavelength as characteristics thereof. Recently although a lamp has been replaced from an electric lamp using filament to a light emitting diode, there is a problem that it is difficult for achromats to see the light. However, the vehicular lamp of the present embodiment can increase the half wavelength of the spectrum of amber light using the light emitting diode. Therefore, the vehicular lamp of the present embodiment can excel in visibility for achromats.

In addition, when obtaining amber light using an electric lamp and an optical filter, the optical filter blocks light of short wavelength similarly to the present embodiment. However, since the electric lamp has spectrum that is uniformly distributed on the whole region of visible light, the light emitting diode has even higher efficiency than the electric lamp as a vehicular lamp that emits amber light when comparing the light emitting diode with than the electric lamp by lm/W (lumen/watt) unit. Here, the lm/W is a unit of efficiency that indicates how much light is emitted for power consumption of 1 W. Although the electric lamp emits strong light in the short wavelength region of visible light, the optical filter blocks all the short light. Therefore, the efficiency of light output for power supply is not very good.

FIG. 10C is shows an alternative embodiment of the present invention. The embodiment of FIG. 10C is different from that of FIG. 10A in that a part of light emitting from a light emitting diode of a vehicular lamp for irradiating amber light is blocked. The vehicular lamp of the present embodiment includes a light emitting diode, a long-wavelength phosphor and an optical filter similarly to the embodiment of FIG. 10A. Here, the transmission limit F1 of the optical filter of the lamp is located at shorter wavelength side than a position 405 of which light intensity is lowest among light of continuous spectrum S3 emitted from the light emitting diode and the long-wavelength phosphor. The lamp has solved a problem that the peak wavelength in amber color shifts due to temperature change in the vehicular lamp using the conventional AlInGaP based light emitting diode, e.g., shown in FIG. 10B. Therefore, it is possible to realize the vehicular lamp excellent in visibility because the wavelength does not shift by temperature change.

In the alternative embodiment shown in FIG. 10C, it is possible to detect light at the transmission limit F1 from the light emitting diode to instantly find degradation of the light emitting diode during operation. The vehicular lamp of the present invention excites the phosphor with light emitting from the light emitting diode and uses the excited light. Thus, it is difficult to detect the wavelength shift by temperature change of the light emitting diode. The larger the wavelength shift is since the initial use, the faster the light emitting diode degrades. Therefore, estimated life of the light emitting diode varied by operation conditions can be estimated when the wavelength shift can be detected during operation of the lamp. In regard to a detection method, when measuring light intensity at the transmission limit by using a light-sensitive element for detecting light of the transmission limit (light in the vicinity of the transmission limit), the light intensity becomes large when the peak wavelength of the light emitting diode shifts toward long wavelength side, and becomes small when the peak wavelength of the light emitting diode shifts toward short wavelength side. It is possible to estimate the life of the light emitting diode by detecting the variation of the light intensity.

Although the present embodiment has been explained regarding the combination of the continuous spectrum S1 having two peaks emitted from the light emitting diode and the long-wavelength phosphor and the transmission limit by the optical filter, this continuous spectrum S1 may also have two or more peaks made by the combination of a plurality of long-wavelength phosphor materials. In this case, the position, of which light intensity is lowest among light of the continuous spectrum emitted from the light emitting diode and the long-wavelength phosphor, is a position that is closest to the transmission limit and also a turning point of the spectrum. The transmission limit of the optical filter may be located at longer wavelength side than that of the point and also shorter wavelength side than that of the peak of the long-wavelength phosphor.

Figure 7:
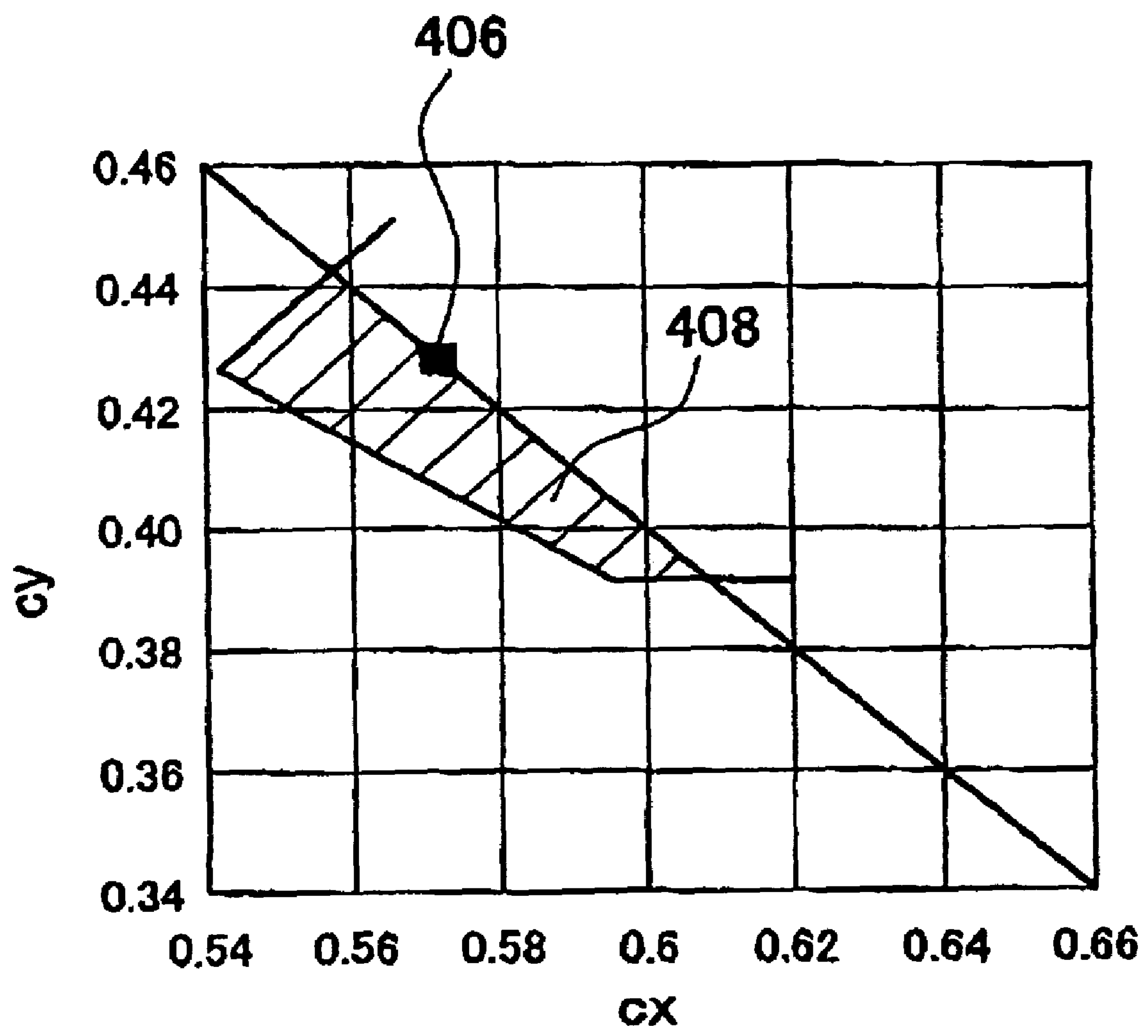
FIG. 7 shows an example of chromaticity of light transmitted by the optical filter.

FIG. 7 shows an example of chromaticity of light transmitted by the optical filter 26. The region 408 (hatched area in the drawing) shows chromaticity range of amber color used in the turn signal lamp. The amber color used in the turn signal lamp is respectively standardized in the United States, Japan, and Europe. For example, the amber color in Japan is standardized in JIS D5500 as orange color as follows.

$0.429 \geqq y \geqq 0.398,\ z \leqq 0.007$

The amber color in Europe is standardized in ECE regulations as follows.

$y \geqq 0.39,\ y \geqq 0.79-0.67x,\ y \leqq x-0.12$

The amber color in the US is standardized in SAE J578c and J578d as follows.

$y=0.39,\ y=0.79-0.67x,\ y=x-0.12$

Where, z=1-x-y, xyz are chromaticity coordinates.

In the present embodiment, the optical filter 26 transmits light of the spectrum explained using FIG. 5 with transmittance explained using FIG. 6. In this case, the optical filter 26 generates light of chromaticity depicted by a point 406. For this reason, according to the present invention, the optical filter 26 generates amber light based on light emitting from the light emitting diode 102 and the phosphor 106. The optical filter 26 may generate light within chromaticity range, which is depicted by the region 408, of amber color used in the turn signal lamp.

Here, when generating the amber light, e.g., with the light emitting diode using AlGaInP, GaAsP or the like, the decrease of an amount of light or the change of wavelength of light may occur by the temperature rise of the vehicular lamp 10 in some cases. However, in the present invention, the LED module 100 generates white light. In this case, in spite of the temperature rise of the vehicular lamp 10, the LED module 100 generates stable light with regard to an amount of light and wavelength. For this reason, according to the present invention, the vehicular lamp 10 can stably irradiate amber light regardless of the temperature change of the vehicular lamp 10.

According to the present embodiment, the vehicular lamp blocks the almost part of light emitting from the light emitting diode, and obtains amber color used in the turn signal lamp with light generated from the phosphor that is excited by light emitting from the light emitting diode. Thus, the vehicular lamp can solve the problem that the peak wavelength of the light emitting diode shifts due to temperature change in the light emitting diode using AlGaInP or the like, thereby realizing the vehicular lamp having excellent visibility because the wavelength does not shift by temperature change according to the present embodiment.

In addition, when using the light emitting diode, e.g., using AlGaInP, GaAsP or the like, increasing the number of the light emitting diode as a countermeasure against the decrease of an amount of light may increase the cost of the vehicular lamp 10. However, in the present embodiment, the optical filter 26 is formed of, e.g., resin at low cost. For this reason, according to the present embodiment, it is possible to provide the vehicular lamp 10 at low cost.

Figure 8:
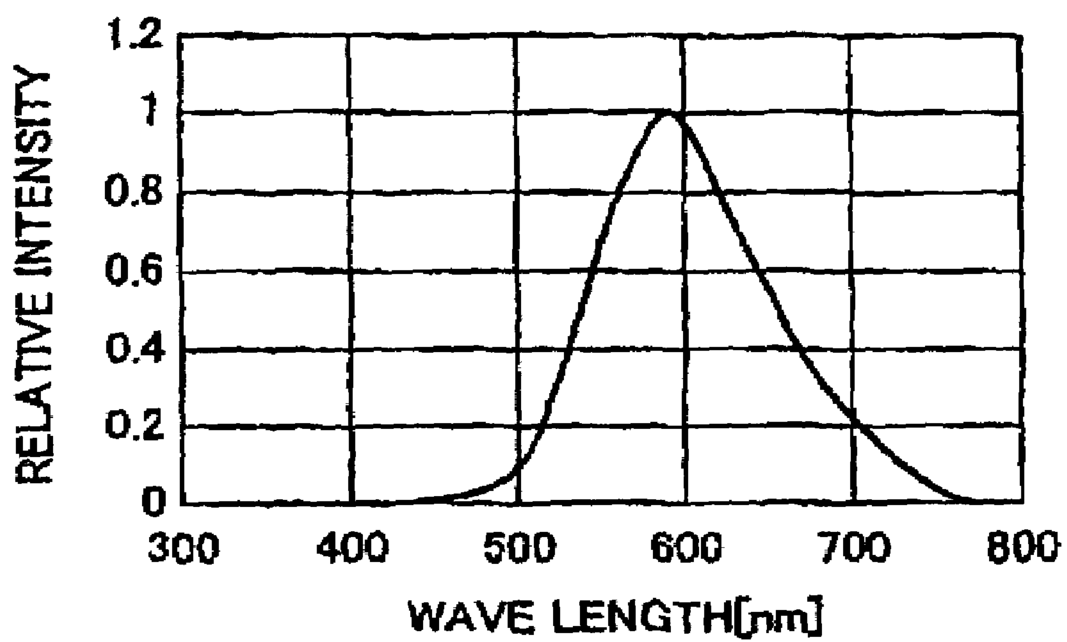
FIG. 8 shows an example of spectrum of light transmitted by the optical filter.

FIG. 8 shows an example of spectrum of light transmitted by the optical filter 26. In the present embodiment, the optical filter 26 generates light having a peak value in the vicinity of 590 nm. It is preferable that the optical filter 26 generates light having a peak value in the range from 587 nm to 596 nm.

Figure 9:
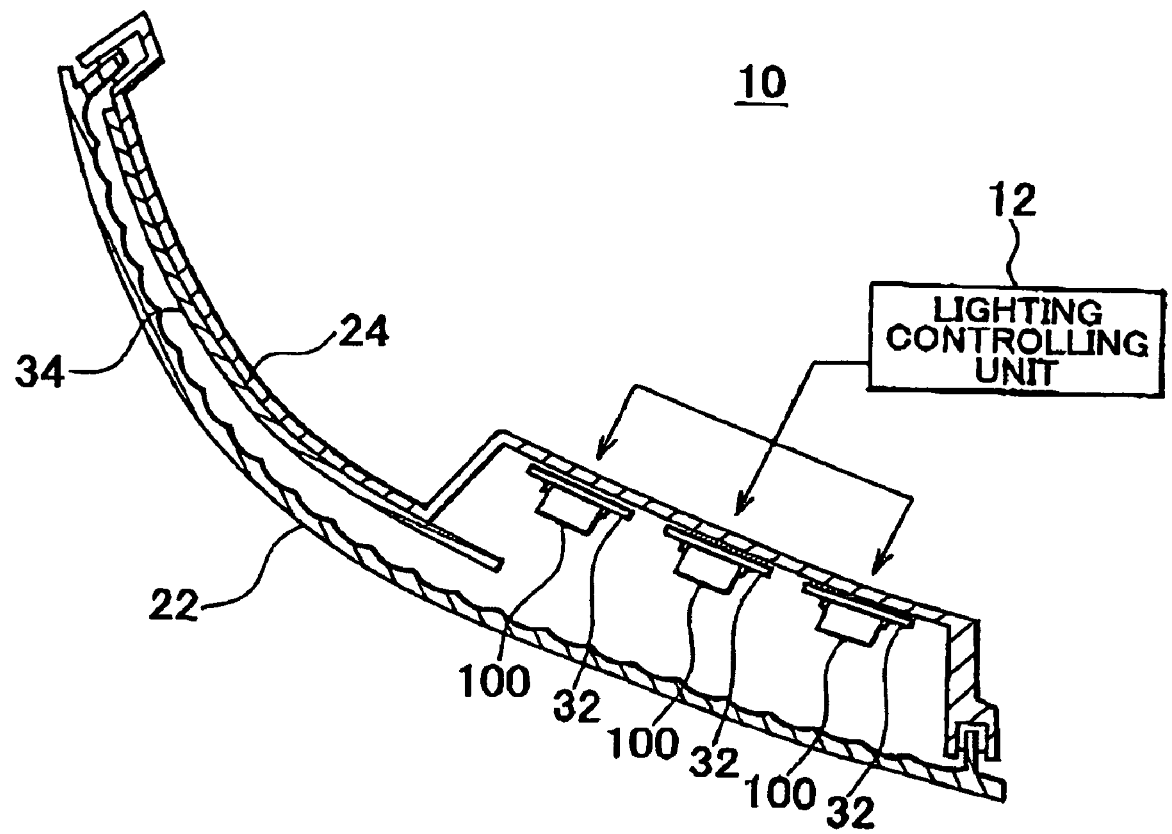
FIG. 9 shows another example of structure of the vehicular lamp.

FIG. 9 shows another example of structure of the vehicular lamp 10. In FIG. 9, the explanation for the components having the reference numeral same as those of FIG. 1 will be omitted because they have functions same as or similar to those of FIG. 1.

In the present embodiment, the outer lens 22 has a function same as or similar to the optical filter 26 (see FIG. 1). In this way, the outer lens 22 generates amber light based on light emitting from the light emitting diode 102 and the phosphor 106. The outer lens 22 is formed of colored and transparent materials so as to have transmittance, e.g., explained using FIG. 6. In the present embodiment, the vehicular lamp 10 can also irradiate amber light stably.

In another embodiment, a photocatalytic film having catalytic action of $TiO_2$ or the like may be provided in a position at which the light emitting from the light emitting diode within the vehicular lamp arrives. Although the photocatalytic film may be provided in any part within the vehicular lamp, it is preferable to provide the photocatalytic film away from a light ejecting part in order to prevent absorption of the ejected light. Furthermore, it is preferable to provide the photocatalytic film in a connection part or in the vicinity of the connection part of optical parts. In this way, it is possible to dissolve moisture penetrated from outside through the connection part or a very small amount of gas generated from a connecting member using catalytic action, thereby realizing longer operating life and improvement of reliability. Therefore, visible light that is blocked and light having shorter wavelength than that of the visible light can be used as a source of light for exciting the phosphor and also be used in photocatalyst effectively.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A vehicular lamp that irradiates amber light, comprising:

a light emitting diode emitting blue light;

a long-wavelength phosphor emitting light, of which a peak wavelength is substantially equal to or longer than a wavelength of the amber light according to the blue light emitting from said light emitting diode;

an optical filter operable to block almost all light emitting from said light emitting diode and also to transmit almost all light, which has a wavelength similar to the peak wavelength, among light emitting from said long-wavelength phosphor to generate the amber light based on the light emitting from said light emitting diode and said long-wavelength phosphor; and a chamber comprising a lamp body and an outer lens, said chamber surrounding said diode, said long wavelength phosphor, and said optical filter.

2. A vehicular lamp as claimed in claim 1, wherein said long-wavelength phosphor comprises $Y_3Al_5O_{12}$:Ce or $Tb_3Al_5O_{12}$:Ce.

3. A vehicular lamp as claimed in claim 1, wherein said long-wavelength phosphor comprises $M_xSi_yN_z$:Eu, where $z=2x/3+4y/3$, M is at least an element selected from a group consisting of alkaline earth metals.

4. A vehicular lamp as claimed in claim 1, wherein said optical filter blocks almost all light having a wavelength of 500 nm or less.

5. A vehicular lamp as claimed in claim 1, wherein said optical filter transmits almost all light having a wavelength of 600 nm or more.

6. A vehicular lamp as claimed in claim 1, wherein said long wavelength phosphor covers the surface of the light emitting diode, said long wavelength phosphor being sealed by a sealing member within the lamp.

7. A vehicular lamp as claimed in claim 1, wherein a plurality of said light emitting diodes are disposed within said chamber.

8. A vehicular lamp that irradiates amber light, comprising:

a light emitting diode;

a long-wavelength phosphor emitting light, of which a peak wavelength is substantially equal to or longer than a wavelength of the amber light according to light emitting from said light emitting diode; and an optical filter operable to block light having shorter wavelength than a transmission limit and transmit light having longer wavelength than the transmission limit, wherein the transmission limit in said optical filter is located between a peak wavelength of light emitting from said light emitting diode and the peak wavelength of light emitting from said long-wavelength phosphor, and is located at longer wavelength side than that of a position of which light intensity is the lowest among light of continuous spectrum emitted from said light emitting diode and said long-wavelength phosphor and also located at shorter wavelength side than that of the peak of light emitting from said long-wavelength phosphor.

9. A vehicular lamp as claimed in claim 8, wherein the transmission limit in said optical filter is located at shorter wavelength side than that of 50% of the peak of light emitting from said long-wavelength phosphor.

10. A vehicular lamp as claimed in claim 8, wherein said long-wavelength phosphor comprises $Y_3Al_5O_{12}$:Ce or $Tb_3Al_5O_{12}$:Ce.

11. A vehicular lamp as claimed in claim 8, wherein said long-wavelength phosphor comprises $M_xSi_yN_z$:Eu, where $z=2x/3+4y/3$, M is at least an element selected from a group consisting of alkaline earth metals.

* * * * *